United States Patent
Sumida et al.

(10) Patent No.: US 9,298,046 B2
(45) Date of Patent: Mar. 29, 2016

(54) LIQUID CRYSTAL DISPLAY PANEL

(71) Applicant: Sharp Kabushiki Kaisha, Osaka-shi, Osaka (JP)

(72) Inventors: Yukihiro Sumida, Osaka (JP); Hiroshi Kawaguchi, Osaka (JP); Hitoshi Yagi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 151 days.

(21) Appl. No.: 14/350,597

(22) PCT Filed: Oct. 15, 2012

(86) PCT No.: PCT/JP2012/076572
§ 371 (c)(1),
(2) Date: Apr. 9, 2014

(87) PCT Pub. No.: WO2013/058202
PCT Pub. Date: Apr. 25, 2013

(65) Prior Publication Data
US 2014/0267991 A1    Sep. 18, 2014

(30) Foreign Application Priority Data
Oct. 19, 2011  (JP) .................... 2011-229391

(51) Int. Cl.
*G02F 1/1343* (2006.01)
*G02F 1/1362* (2006.01)
*H01L 21/00* (2006.01)
*G02F 1/1345* (2006.01)

(52) U.S. Cl.
CPC ........ *G02F 1/1343* (2013.01); *G02F 1/136204* (2013.01); *G02F 1/1345* (2013.01); *G02F 1/136286* (2013.01); *G02F 2001/136218* (2013.01); *H01L 21/00* (2013.01)

(58) Field of Classification Search
CPC ............... H01L 2224/48227; G02F 2202/28; G02F 1/13452; G02F 1/1345
See application file for complete search history.

(56) References Cited

U.S. PATENT DOCUMENTS 5,870,160 A    2/1999  Yanagawa et al.
6,034,757 A    3/2000  Yanagawa et al.
(Continued)

FOREIGN PATENT DOCUMENTS

CN    101998762 A    3/2011
JP    06-021500 A    1/1994
(Continued)

OTHER PUBLICATIONS

Official Communication issued in International Patent Application No. PCT/JP2012/076572, mailed on Dec. 11, 2012.

*Primary Examiner* — Wen-Ying P Chen
(74) *Attorney, Agent, or Firm* — Keating & Bennett, LLP (57) ABSTRACT

A conductive film (12) that covers the upper surface of a CF glass substrate (11) or the upper surface of a polarization plate (13) overlaid on the CF glass substrate is provided. The conductive film and a ground electrode (16) on a TFT glass substrate (10) are electrically connected with a conductive tape (20) having adherence. Then, a conductive paste (22), (23) is adhered to a part so as to be placed on both the conductive tape and the conductive film, and is adhered to a part so as to be placed on both the conductive tape and the ground electrode. The conductive tape is provided with a length allowance such that the entire length is longer than the shortest distance between a connection part between the conductive tape and the conductive film and a connection part between the conductive tape and the ground electrode.

4 Claims, 13 Drawing Sheets

(56) References Cited

U.S. PATENT DOCUMENTS

| | | |
|---|---|---|
| 6,108,066 A | 8/2000 | Yanagawa et al. |
| 2007/0279570 A1* | 12/2007 | Ichikawa ............ G02F 1/13452 349/150 |
| 2011/0051068 A1* | 3/2011 | Kamon ............... G02F 1/13452 349/152 |
| 2013/0162922 A1 | 6/2013 | Kamon et al. |
| 2014/0036181 A1 | 2/2014 | Kamon et al. |

FOREIGN PATENT DOCUMENTS

| | | |
|---|---|---|
| JP | 09-105918 A | 4/1997 |
| JP | 2004-279460 A | 10/2004 |
| JP | 2008-145462 A | 6/2008 |
| JP | 2010-026324 A | 2/2010 |

\* cited by examiner

LIQUID CRYSTAL DISPLAY PANEL

TECHNICAL FIELD

The present invention relates to a liquid crystal display panel.

BACKGROUND ART

A way to obtain a wide-viewing-angle liquid crystal display panel is to adopt an in-plane switching mode. In the in-plane switching mode, switching is performed such that liquid crystal molecules are kept horizontal with respect to a substrate, and since the liquid crystal molecules are prevented from getting slanted, optical characteristics are hardly to be affected by viewing angle, and thus it is possible to obtain a wide viewing angle. See patent documents 1 and 2 for examples of the liquid crystal display panel adopting the in-plane switching mode.

In the liquid crystal display panel adopting the in-plane switching mode, when a high potential, such as high voltage caused by static electricity, is applied from the outside, display is disadvantageously disturbed by charging. In order to solve this problem, patent document 2 proposes that a conductive layer having translucency is formed on one of the transparent substrates in the liquid crystal display panel, the one disposed on the opposite side to a liquid crystal layer, namely a CF glass substrate, on a surface thereof at a far side from a backlight unit.

In the liquid crystal display panel adopting the in-plane switching mode, when in order to prevent static charge, a conductive film is provided that covers the upper surface of the CF glass substrate or the upper surface of a polarization plate overlaid on the CF glass substrate, the conductive film needs to be grounded. Patent document 2 also discloses various grounding methods. An example of conventional grounding method is shown in FIGS. 10 and 11.

Figure 10:
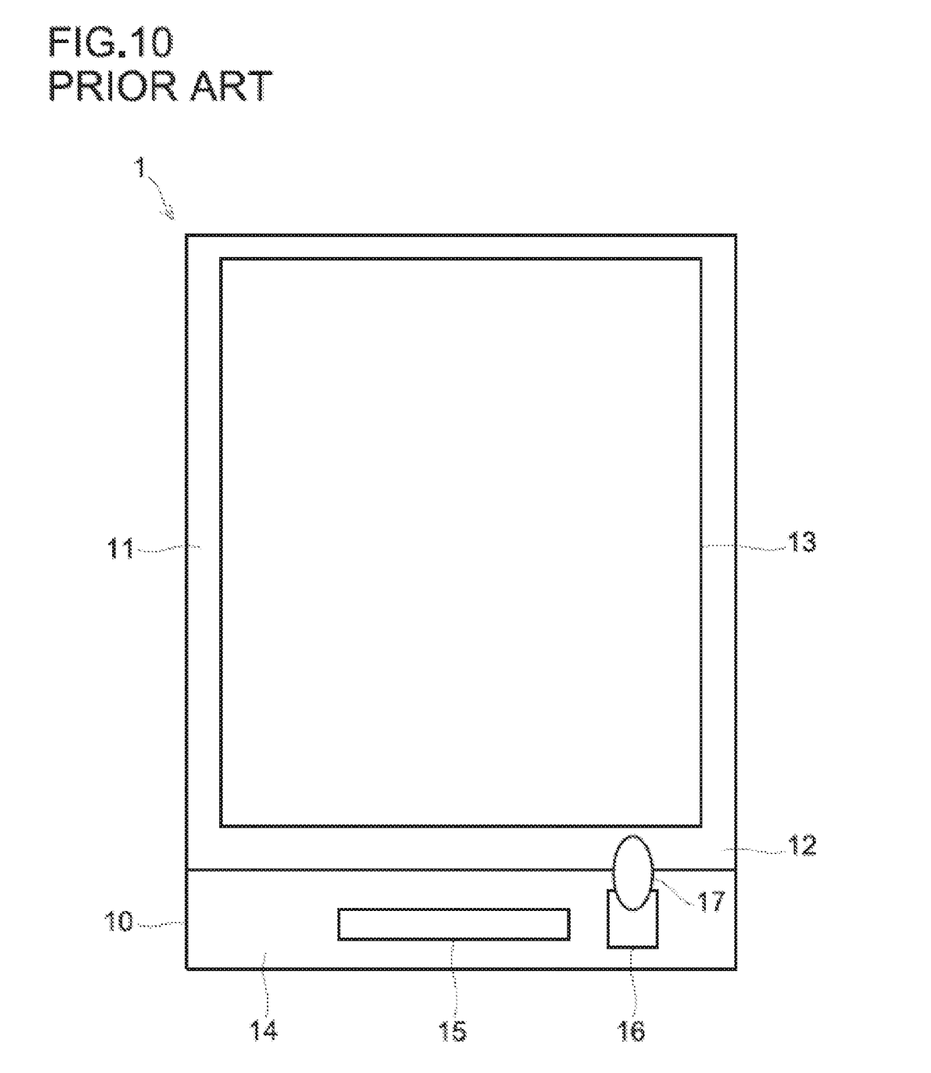
FIG. 10 A schematic plan view showing an example of a conventional structure of a liquid crystal display panel.
Figure 11:
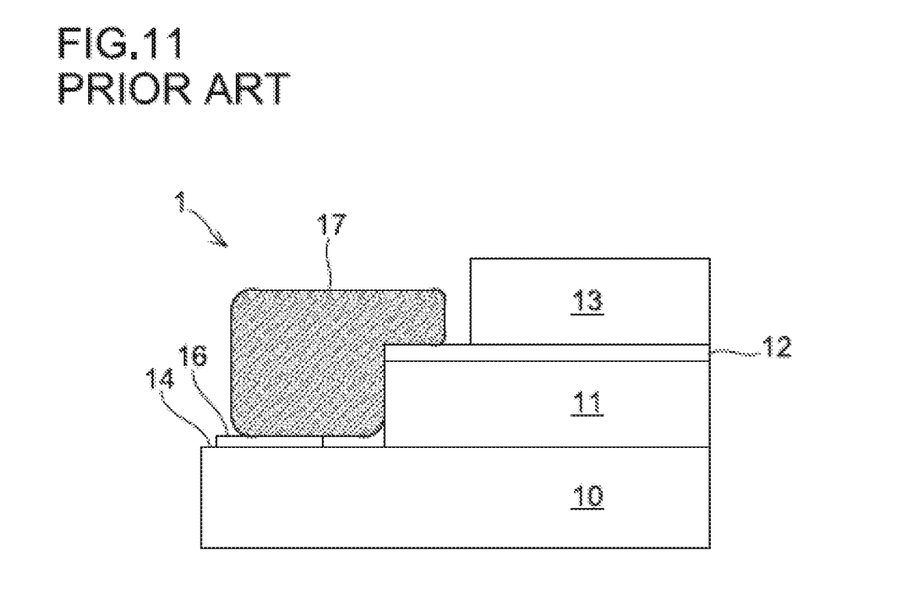
FIG. 11 A partial schematic cross-sectional view of the liquid crystal display panel of FIG. 10.

The liquid crystal display panel 1 adopting the in-plane switching mode shown in FIG. 10 has a cross-sectional structure shown in FIG. 11. Specifically, on the upper surface of a thin film transistor (hereinafter abbreviated as a "TFT") glass substrate 10, a color filter (hereinafter abbreviated as a "CF") glass substrate 11 is overlaid. A liquid crystal layer (not shown) is sealed in between the TFT glass substrate 10 and the CF glass substrate 11. A transparent conductive film 12 is formed so as to cover the upper surface of the CF glass substrate 11. The conductive film 12 covers the entire display region of the liquid crystal display panel 1. A polarization plate 13 is overlaid on the conductive film 12.

The dimension of the TFT glass substrate 10 in the vertical direction of in FIG. 10 is greater than that of the CF glass substrate 11, and a part of the TFT glass substrate 10 protrudes from the CF glass substrate 11. The protruding part forms an external connection region 14. A driver 15 of the liquid crystal display panel 1 is arranged on the external connection region 14, and also a ground electrode 16 for grounding is formed on the external connection region 14.

An electrical connection between the conductive film 12 and the ground electrode 16 is established in the following manner. A conductive paste 17 is adhered to a portion crossing a border between the conductive film 12 and the ground electrode 16. The conductive paste 17 forms the electrical connection. Then, the conductive paste 17 is heated, thereby a solvent is evaporated from the conductive paste 17 and the conductive paste 17 is cured. As the conductive paste 17, for example, a silver paste is used.

Figure 12:
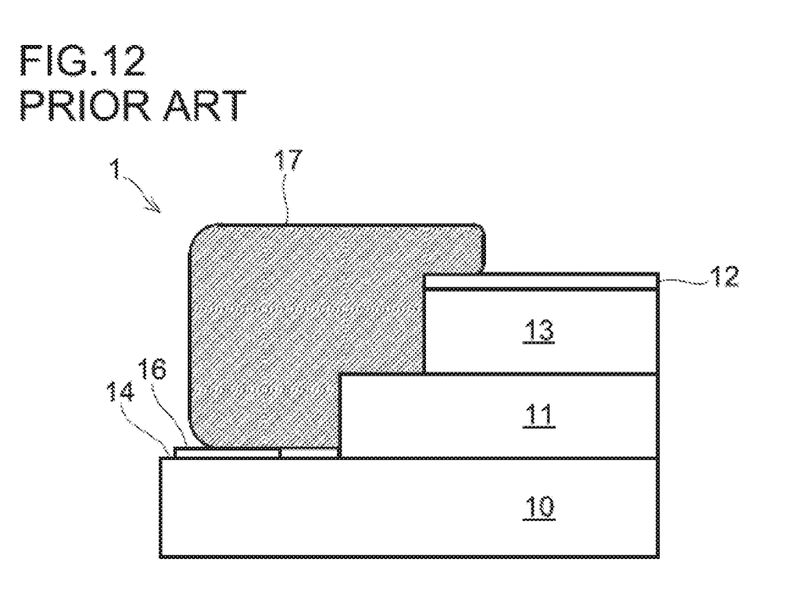
FIG. 12 A partial schematic cross-sectional view showing another example of the conventional structure of the liquid crystal display panel.

As shown in FIG. 12, it is possible for the conductive film 12 to cover the upper surface of the polarization plate 13 instead of CF glass substrate 11. In this case, the conductive paste 17 that is adhered to the portion crossing the border between the conductive film 12 and the ground electrode 16 is inevitably in contact with the CF glass substrate 11 halfway the span of the conductive paste 17.

RELATED ART DOCUMENT

Patent Document

Patent document 1: JP-A-2010-26324
Patent document 2: JP-A-9-105918

DISCLOSURE OF THE INVENTION

Problems to be Solved by the Invention

When the electrical connection between the conductive film 12 and the ground electrode 16 is established with the conductive paste 17, as in the example shown in FIGS. 10 to 12, the following problem occurs. Specifically, the cured conductive paste 17 is brittle and is easily cracked. If a difference in thermal expansion between the TFT glass substrate 10 and a member on which the conductive film 12 is provided is substantial, a crack becomes a serious problem.

In the example shown in FIGS. 10 and 11, the conductive film 12 is provided on the CF glass substrate 11, and thus a difference in thermal expansion coefficient between the CF glass substrate 11 and the TFT glass substrate 10 becomes a concern. As in the example shown in FIG. 12, when the conductive film 12 is formed not on the upper surface of the CF glass substrate 11 but on the upper surface of the polarization plate 13, the difference in thermal expansion coefficient becomes an extremely serious concern.

Figure 13:
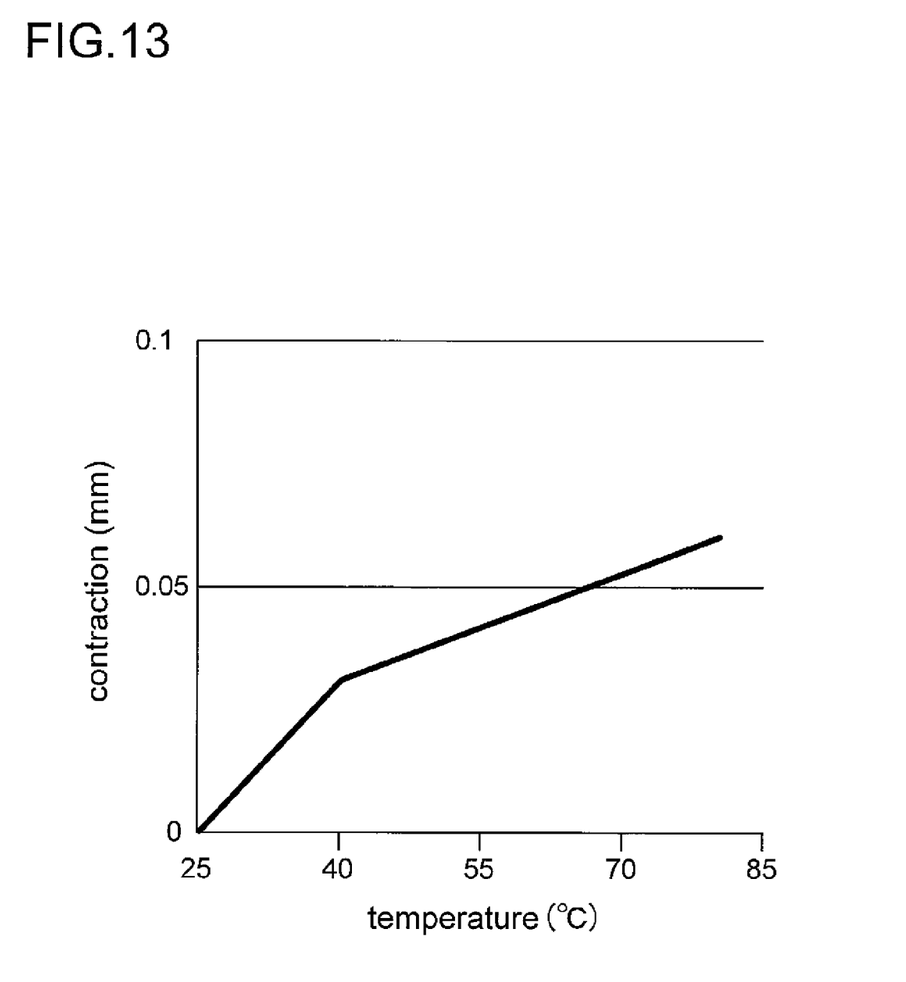
FIG. 13 A graph of a thermal contraction of a polarization plate.

Normally, a TAC (triacetylcellulose) film and a PVA (polyvinyl alcohol) give a basic structure of the polarization plate 13, and a COP (cycloolefin polymer) or the like is used as a phase difference layer. The polarization plate 13 of such a structure has a characteristic that as its temperature is increased, it contracts. As shown in FIG. 13, a contraction is about 0.06 mm at 80° C.

Since as described above, the polarization plate 13 contracts at 80° C. by about 0.06 mm whereas the CF glass substrate 11 expands at the same temperature, the conductive paste 17 that is fixed to the conductive film 12 on the polarization plate 13 and that is also in contact with the CF glass substrate 11 is subjected to great stress, and an occurrence of a crack is inevitable. If a crack appears in the conductive paste 17, the grounding of the conductive film 12 becomes unstable. In such a state, when a high potential, such as high voltage caused by static electricity, is applied from the outside, unevenness in display is produced in the liquid crystal display panel 1.

The present invention is made in view of the foregoing problem; an object of the present invention is to provide a liquid crystal display panel adopting the in-plane switching mode, in which the state of grounding of a conductive film covering an upper surface of a CF glass substrate or an upper surface of a polarization plate overlaid on the CF glass substrate can be stably maintained even in a high-temperature or low-temperature environment.

Means for Solving the Problem

To achieve the above object, according to the present invention, there is provided a liquid crystal display panel in which a conductive film that covers an upper surface of a CF glass substrate or an upper surface of a polarization plate overlaid on the CF glass substrate is provided and the conductive film and a ground electrode on a TFT glass substrate are electrically connected, wherein the conductive film and the ground electrode are electrically connected with a conductive tape having adherence. A conductive paste is adhered to, a part crossing a border between the conductive tape and the conductive film and a part crossing a border between the conductive tape and the ground electrode.

Preferably, in the liquid crystal display panel configured as described above, the conductive tape is provided with an allowance in a length thereof such that the entire length of the conductive tape is longer than the shortest distance between a connection part between the conductive tape and the conductive film and a connection part between the conductive tape and the ground electrode.

Preferably, in the liquid crystal display panel configured as described above, the conductive tape is provided with the allowance in the length thereof in a plane parallel to a display surface of the liquid crystal display panel.

Preferably, in the liquid crystal display panel configured as described above, the conductive tape is provided with the allowance in the length thereof in the direction normal to the display surface of the liquid crystal display panel.

Preferably, in the liquid crystal display panel configured as described above, in the conductive tape, at parts other than a connection part to the conductive film and a connection part to the ground electrode, an adherence agent is removed.

Preferably, in the liquid crystal display panel configured as described above, the conductive paste is a silver paste.

Advantages of the Invention

According to the present invention, since a conductive film and a ground electrode are electrically connected by a conductive tape having adherence, a difference in thermal expansion coefficient between a TFT glass substrate, a CF glass substrate and a polarization plate is absorbed by the deformation of the conductive tape. Thus, it is possible to reliably maintain the electrical connection between the conductive film and the ground electrode even in a high-temperature or low-temperature environment. It is also possible to constantly keep the display quality of a liquid crystal display panel at a given level or more. Since the electrical connection is not established simply with a conductive tape but a conductive paste is adhered to both a part crossing a border between the conductive tape and the conductive film and a part crossing a border between the conductive tape and the ground electrode, even if an adherence agent is degraded, and thus the conductive tape tends to be separated from the adherence agent, the conductive paste prevents such separation, with the result that stable electrical connection is maintained for a long time.

DESCRIPTION OF EMBODIMENTS

First to fourth embodiments of a liquid crystal display panel according to the present invention will be described below with reference to FIGS. 1 to 9. In any embodiment, constituent elements that are functionally common to those of a conventional structure shown in FIGS. 10 to 12 are identified with symbols used in FIGS. 10 to 12, and their description will be omitted.

Figure 1:
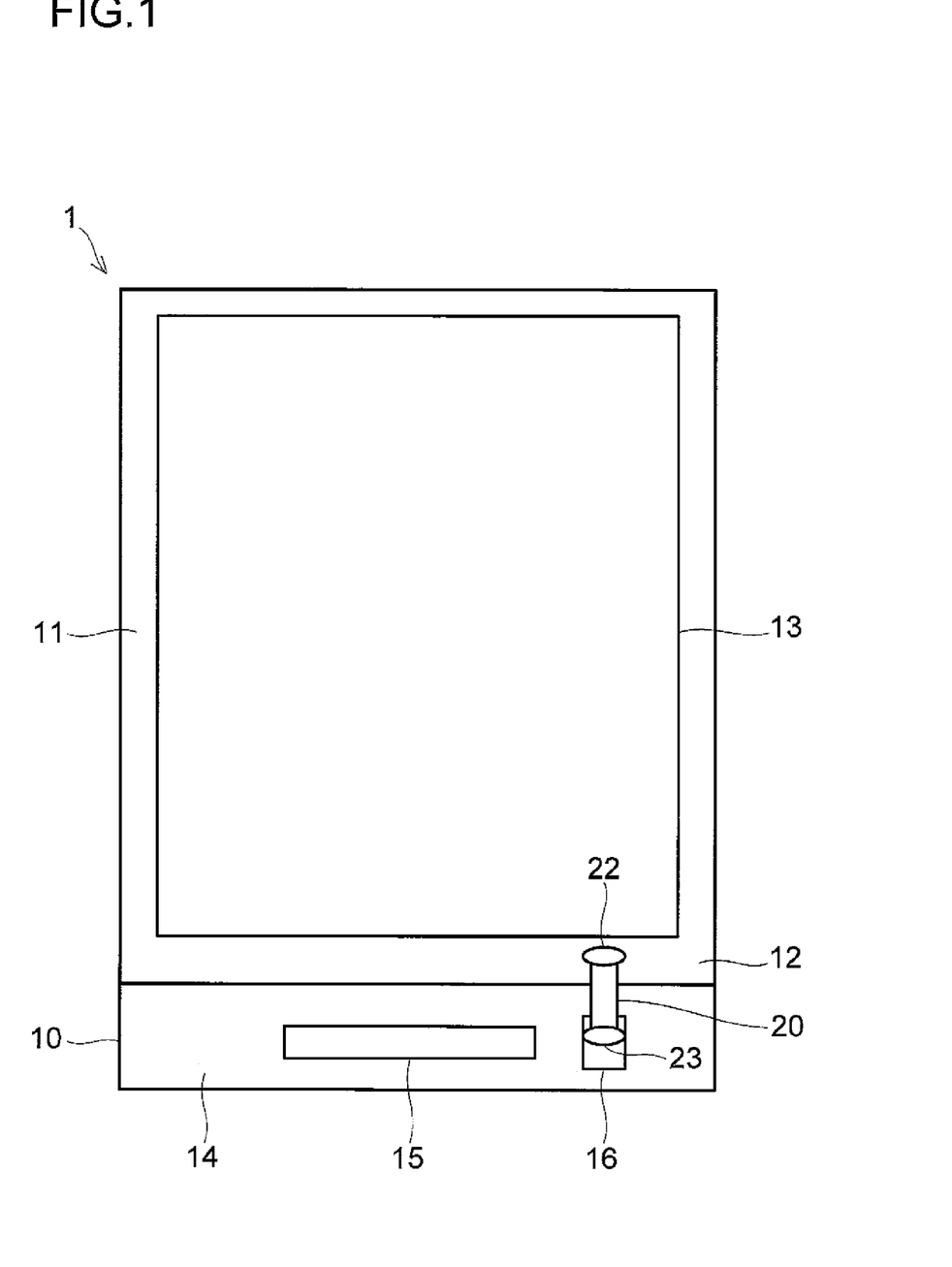
FIG. 1 A schematic plan view showing a first embodiment of a liquid crystal display panel according to the present invention.
Figure 2:
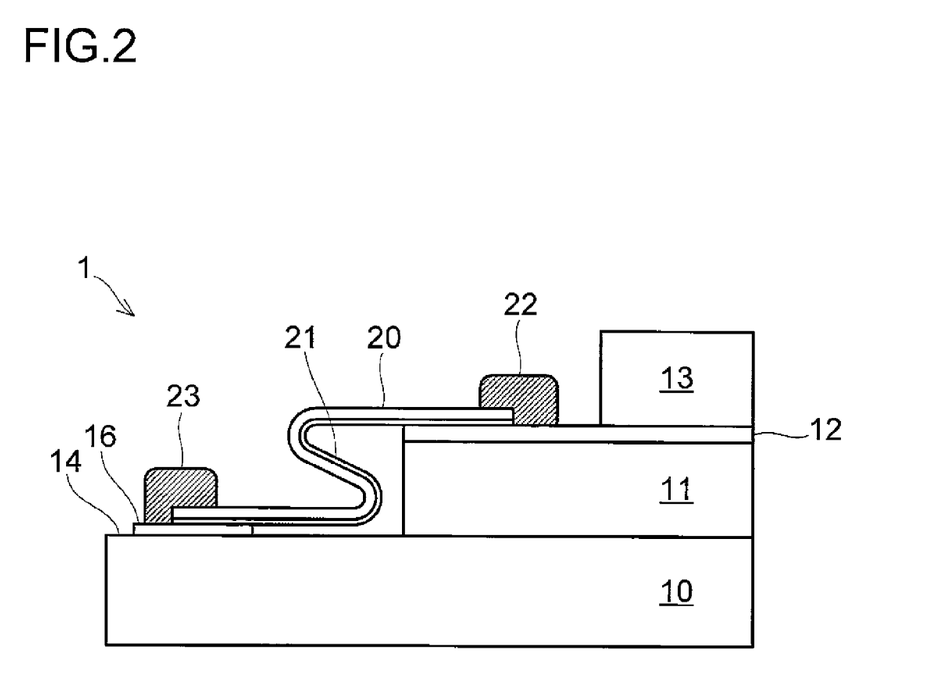
FIG. 2 A partial schematic cross-sectional view of the liquid crystal display panel according to the first embodiment.

The first embodiment is shown in FIGS. 1 and 2. In the liquid crystal display panel 1 of the first embodiment, the upper surface of a CF glass substrate 11 is converted with a conductive film 12 having translucency. The conductive film 12 and a ground electrode 16 are electrically connected with a conductive tape 20. Specifically, one end of a surface coated with an adherence agent 21 in the conductive tape 20 is adhered to the conductive film 12, and the other end of the same surface is adhered to the ground electrode 16.

A conductive paste 22 is adhered to a part crossing a border between the conductive tape 20 and the conductive film 12. A conductive paste 23 is adhered to a part crossing a border between the conductive tape 20 and the ground electrode 16. As the conductive pastes 22 and 23, a silver paste is preferable.

Then, the conductive pastes 22 and 23 are heated, thereby a solvent is evaporated from the conductive pastes 22 and 23 and the conductive pastes 22 and 23 are cured. Thus, the conductive paste 22 is securely adhered to the conductive tape 20 and the conductive film 12, and the conductive paste 23 is securely adhered to the conductive tape 20 and the ground electrode 16. Even if the adherence agent 21 is degraded with time, and thus the conductive tape 20 tends to be separated from the adherence agent 21 or the ground electrode 16, the conductive pastes 22 and 23 prevent such separation, with the result that stable electrical connection is maintained for a long time.

The conductive tape 20 is provided with an allowance in a length thereof such that the entire length of the conductive tape 20 is longer than the shortest distance between a connection part between the conductive tape 20 and the conductive film 13 and a connection part between the conductive tape 20 and the ground electrode 16. The length allowance is prevented from being shorter than about 0.06 mm, that is an amount of contraction in the polarization plate 13 when the temperature of the polarization plate 13 is 80° C.

In the first embodiment, the conductive tape 20 is provided with the allowance in the length thereof in the direction normal to the display surface of the liquid crystal display panel 1. Specifically, as shown in FIG. 2, the conductive tape 20 is bent in shape of letter Z halfway along the conductive tape 20, and when the liquid crystal display panel 1 is placed in a high-temperature or low-temperature environment, the shape of letter Z is deformed to absorb a difference in thermal expansion coefficient between the members. In the first embodiment, even if a non-negligible thermal expansion coefficient difference is present between the TFT glass substrate 10 and the CF glass substrate 11, great stress is not applied to the conductive pastes 22 and 23. Hence, no crack is produced in the conductive pastes 22 and 23, and the state of grounding of the conductive film 12 by the conductive tape 20 is stably maintained. Thus, the liquid crystal display panel 1 becomes excellent in portability in particular.

Figure 3:
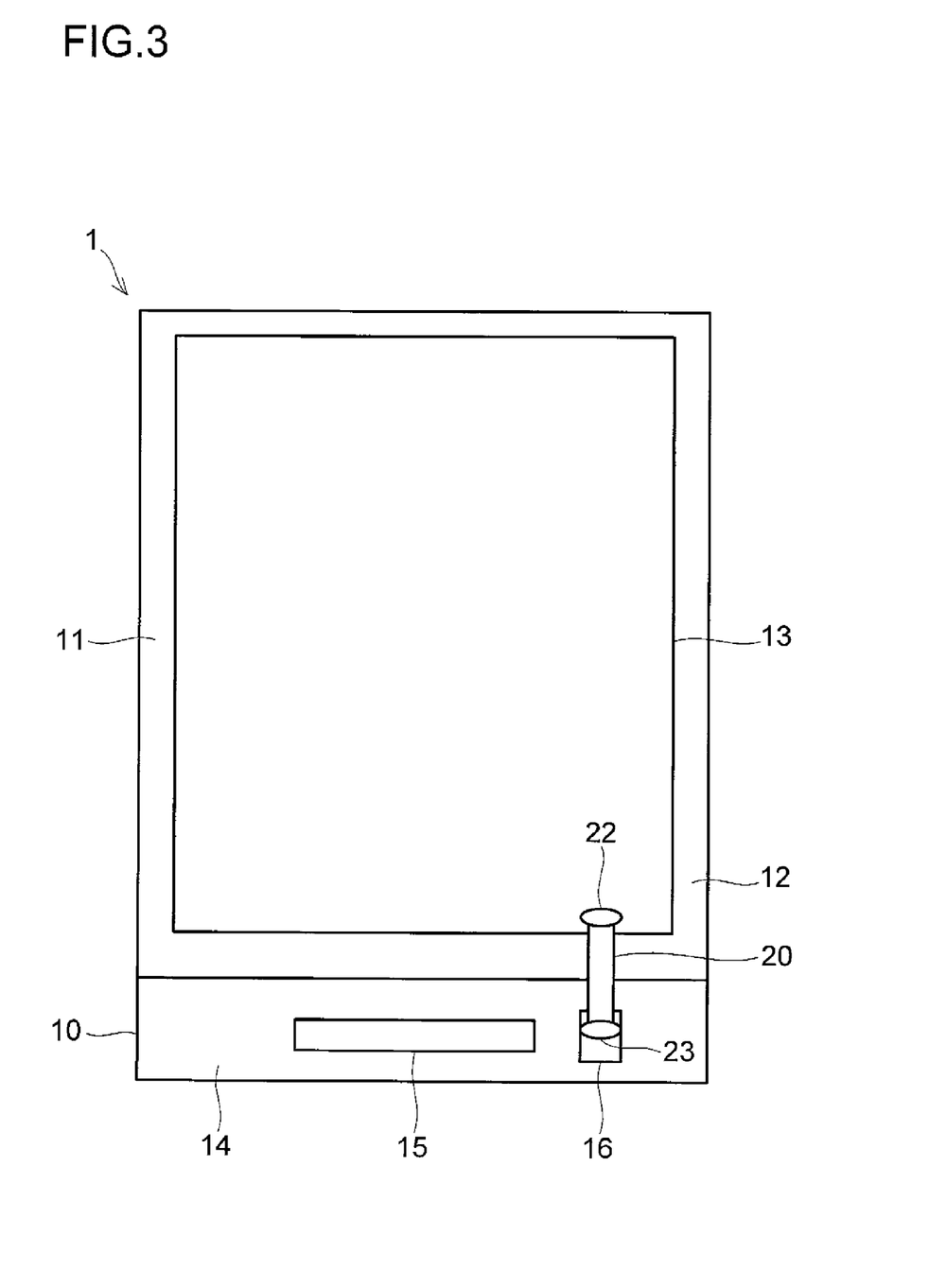
FIG. 3 A schematic plan view showing a second embodiment of the liquid crystal display panel according to the present invention.
Figure 4:
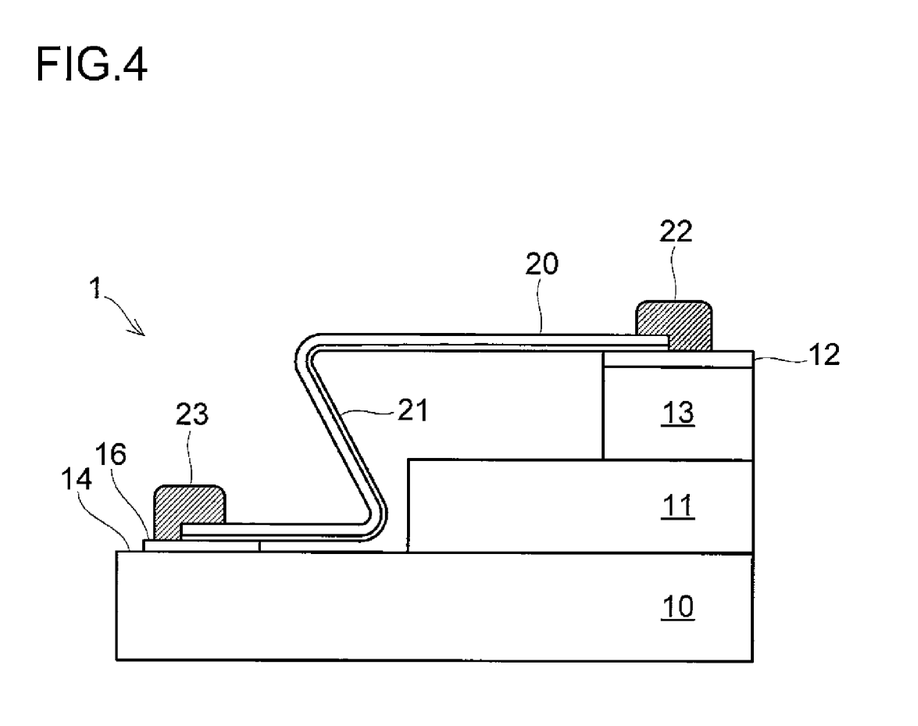
FIG. 4 A partial schematic cross-sectional view of a liquid crystal display panel according to the second embodiment.

The second embodiment is shown in FIGS. 3 and 4. In the liquid crystal display panel 1 of the second embodiment, the conductive film 12 covers not the CF glass substrate 11 but the upper surface of the polarization plate 13. The entire length of the conductive tape 20 that electrically connects the ground electrode 16 and the conductive film 12 is longer than that of the conductive tape 20 of the first embodiment.

The conductive paste 22 is adhered to a part crossing a border between the conductive tape 20 and the conductive film 12, and the conductive paste 23 is adhered to a part crossing a border between the conductive tape 20 and the ground electrode 16, as in the first embodiment. The conductive tape 20 is bent halfway thereof in shape of letter Z, and thus the conductive tape 20 is provided with an allowance in the length thereof in the direction normal to the liquid crystal display panel 1. Since when the liquid crystal display panel 1 is placed in a high-temperature or low-temperature environment, the shape of letter Z is deformed to absorb a difference in thermal expansion coefficient between the members, though a difference in thermal expansion coefficient between the polarization plate 13 and the CF glass substrate 11 is present, great stress is not applied to the conductive pastes 22 and 23. Hence, no crack is produced in the conductive pastes 22 and 23, and the state of grounding of the conductive film 12 by the conductive tape 20 is stably maintained.

Figure 5:
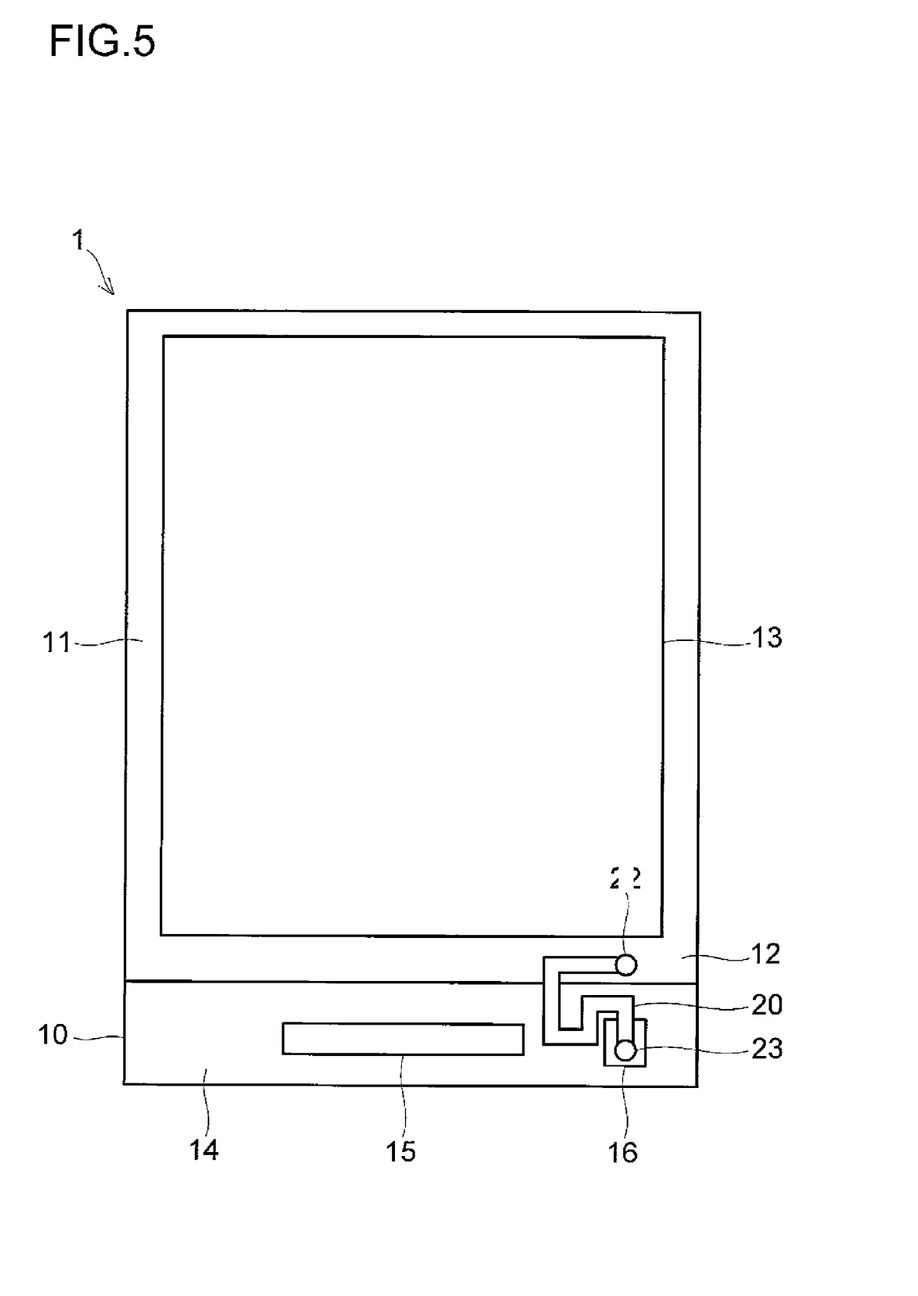
FIG. 5 A schematic plan view showing a third embodiment of the liquid crystal display panel according to the present invention.
Figure 6:
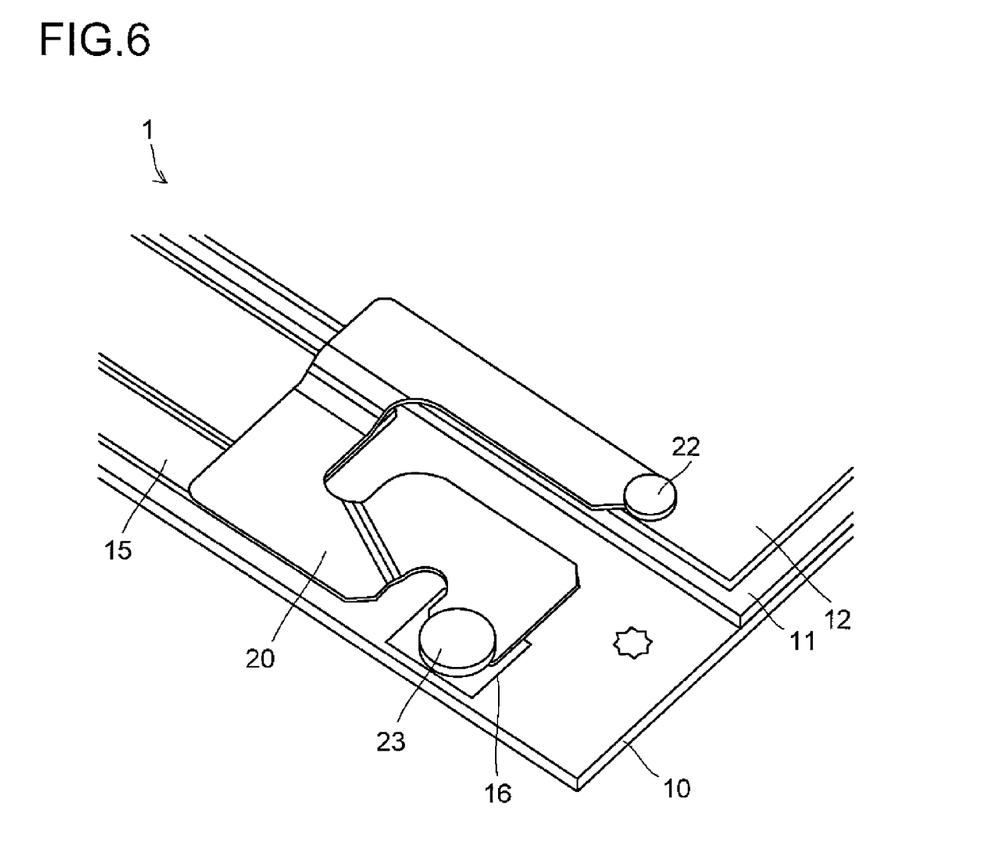
FIG. 6 A partial perspective view of the liquid crystal display panel according to the third embodiment.
Figure 7:
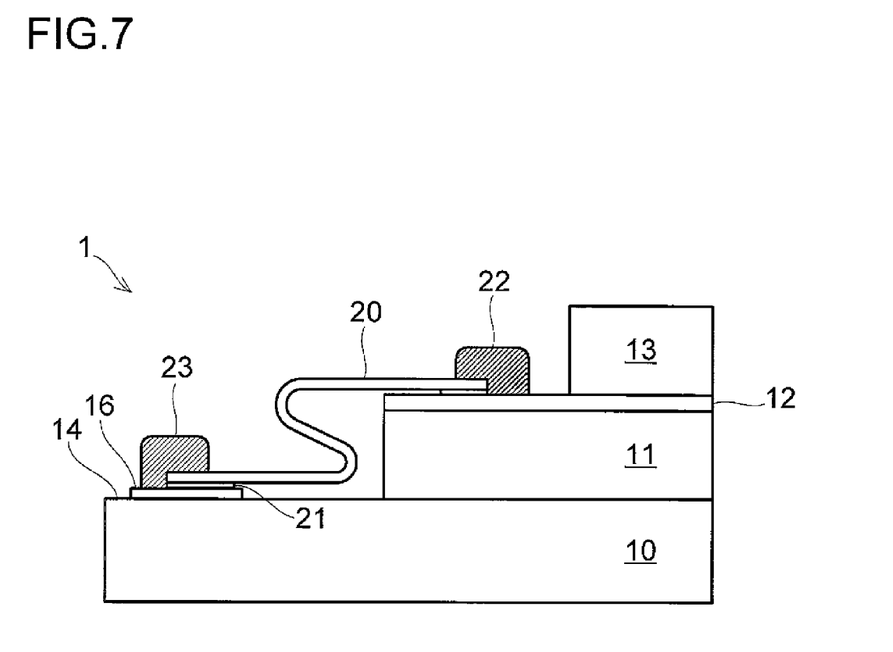
FIG. 7 A partial schematic cross-sectional view of the liquid crystal display panel according to the third embodiment.

The third embodiment is shown in FIGS. 5 to 7. The third embodiment differs from the first and second embodiments in the planar shape of the conductive tape. Specifically, the planar shapes of the conductive tape 20 of the first embodiment and the conductive tape 20 of the second embodiment are straight. The conductive tape 20 that is used to electrically connect the conductive film 12 on the CF glass substrate 11 and the ground electrode 16 in the liquid crystal display panel 1 of the third embodiment has bends in its planar shape. In the bent shape shown in FIGS. 5 and 6, five perpendicularly bent corners are provided.

The conductive tape 20 is provided with a an allowance in the length thereof in a plane parallel to the display surface of the liquid crystal display panel 1 due to the bent shape. Since when the liquid crystal display panel 1 is placed in a high-temperature or low-temperature environment, the bent shape is deformed to absorb a difference in thermal expansion coefficient between the members, even if a non-negligible thermal expansion coefficient difference is present between the TFT glass substrate 10 and the CF glass substrate 11, great stress is not applied to the conductive pastes 22 and 23. Hence, no crack is produced in the conductive pastes 22 and 23, and the state of grounding of the conductive film 12 by the conductive tape 20 is stably maintained.

Since the conductive tape 20 is provided with a the allowance in the length thereof in the plane parallel to the display surface of the liquid crystal display panel 1, the thickness of the liquid crystal display panel 1 is prevented from being increased by the conductive tape 20. However, as shown in FIG. 7, bending in the shape of letter Z is provided in the conductive tape 20, and thus the conductive tape 20 may also be provided with an allowance in a length thereof in the direction normal to the display surface of the liquid crystal display panel 1 at the same time.

In the conductive tape 20 of the third embodiment, at parts other than the connection part to the conductive film 12 and the connection part to the ground electrode 16, the adherence agent 21 is removed. In this way, the parts other than the connection parts are prevented from adhering to the TFT glass substrate 10 and the CF glass substrate 11 to obstruct free movement of the conductive tape 20.

Figure 8:
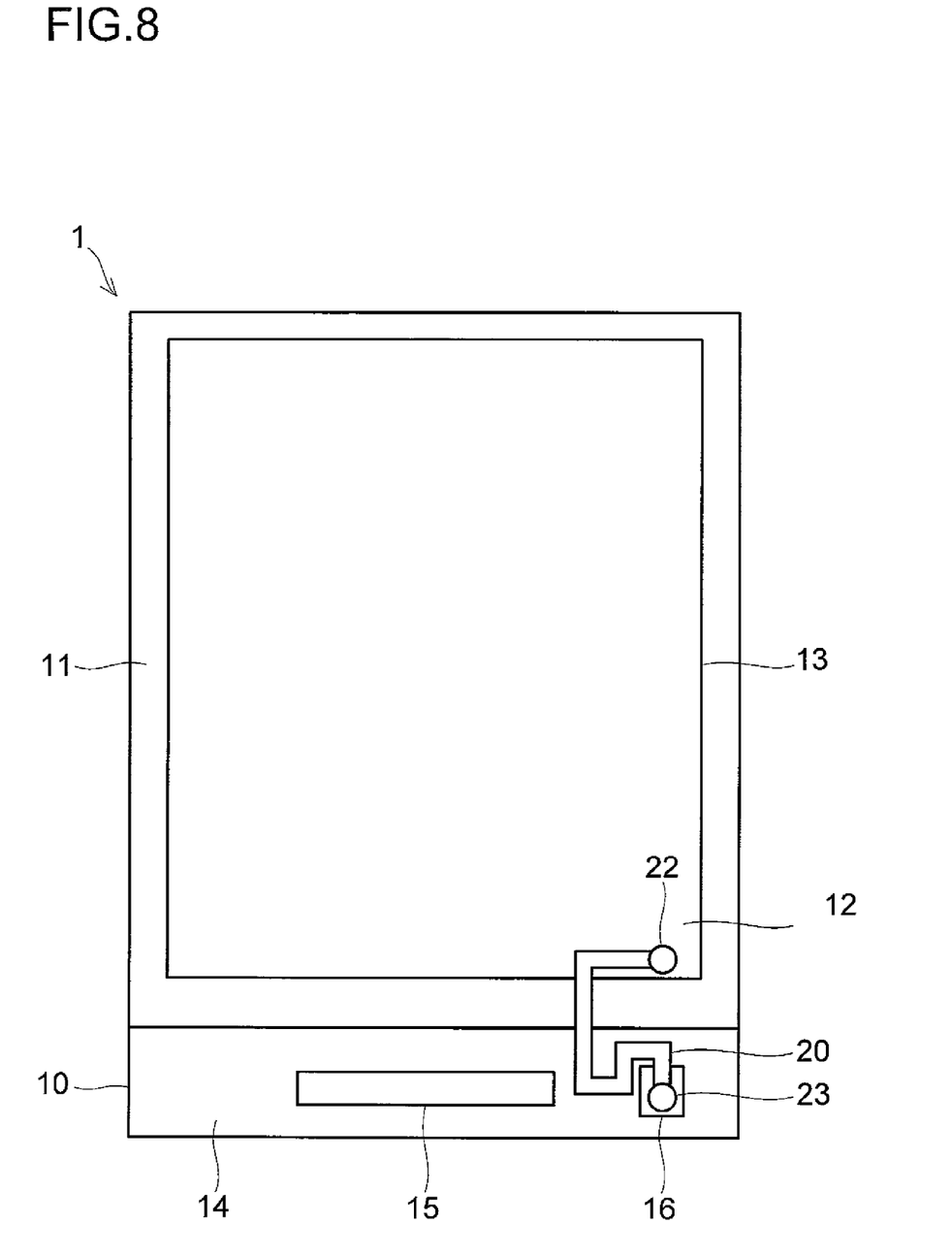
FIG. 8 A schematic plan view showing a fourth embodiment of the liquid crystal display panel according to the present invention.
Figure 9:
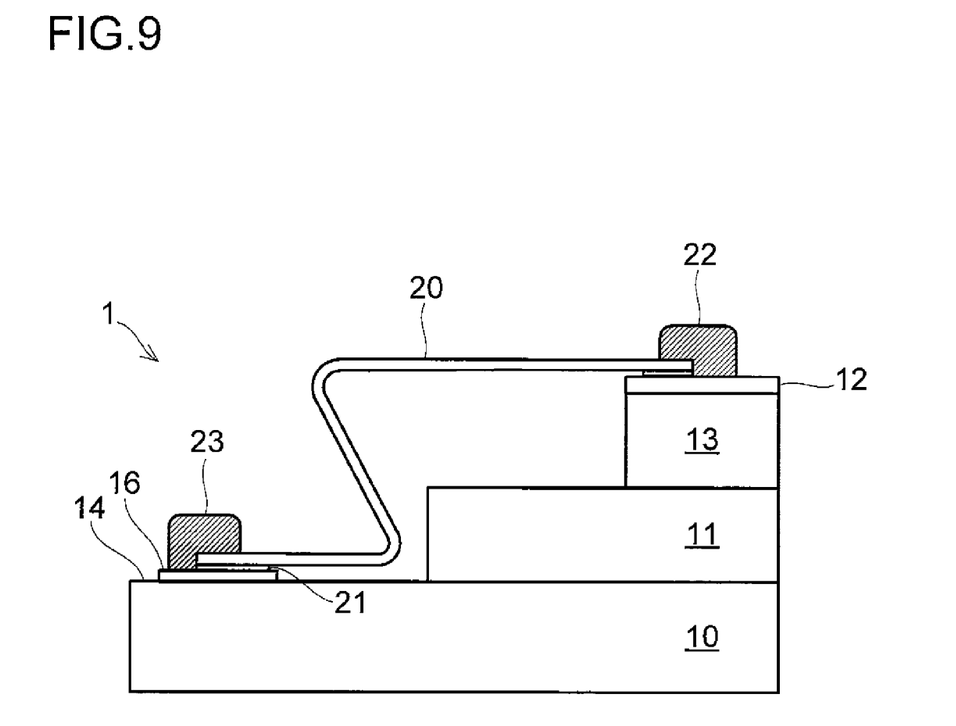
FIG. 9 A partial schematic cross-sectional view of the liquid crystal display panel according to the fourth embodiment.

The fourth embodiment is shown in FIGS. 8 and 9. In the liquid crystal display panel 1 of the fourth embodiment, the conductive film 12 covers not the CF glass substrate 11 but the upper surface of the polarization plate 13. Although the conductive tape 20 that electrically connects the ground electrode 16 and the conductive film 12 is bent in its planar shape as in the conductive tape 20 of the third embodiment, the entire length thereof is longer than that of the conductive tape 20 of the third embodiment.

The conductive tape 20 is provided with an allowance in the length thereof in the plane parallel to the display surface of the liquid crystal display panel 1 due to the bent shape. Since when the liquid crystal display panel 1 is placed in a high-temperature or low-temperature environment, the bent shape is deformed to absorb a difference in thermal expansion coefficient between the members, though a thermal expansion coefficient difference is present between the polarization plate 13 and the CF glass substrate 11, great stress is not applied to the conductive pastes 22 and 23. Hence, no crack is produced in the conductive pastes 22 and 23, and the state of grounding of the conductive film 12 by the conductive tape 20 is stably maintained.

Since the conductive tape 20 is provided with a the allowance in the length thereof in the plane parallel to the display surface of the liquid crystal display panel 1, the thickness of the liquid crystal display panel 1 is prevented from being increased by the conductive tape 20. However, as shown in FIG. 9, bending in the shape of letter Z is provided in the conductive tape 20, and thus the conductive tape 20 may also be provided with an allowance in a length thereof in the direction normal to the display surface of the liquid crystal display panel 1 at the same time.

In the conductive tape 20 of the fourth embodiment, at parts other than the connection part to the conductive film 12 and the connection part to the ground electrode 16, the adherence agent 21 is removed. In this way, the parts other than the connection parts are prevented from adhering to the TFT glass substrate 10 and the CF glass substrate 11 to obstruct free movement of the conductive tape 20.

The removal of the adherence agent from the conductive tape 20 at the parts other than the connection part to the conductive film 12 and the connection part to the ground electrode 16 as described above can be applied to the first and second embodiments.

The embodiments of the present invention have been described above. The scope of the present invention is not limited to these embodiments; various modifications are possible without departing from the spirit of the present invention.

INDUSTRIAL APPLICABILITY

The present invention can be widely applied to the liquid crystal display panel adopting the in-plane switching mode; in particular, the present invention is significantly effective when it is applied to a liquid crystal display panel used in a portable device.

LIST OF REFERENCE SYMBOLS

1 liquid crystal display panel
10 TFT glass substrate
11 CF glass substrate
12 conductive film
13 polarization plate
16 ground electrode
20 conductive tape
21 adherence agent
22, 23 conductive paste

The invention claimed is:

1. A liquid crystal display panel in which a conductive film that convers an upper surface of a CF glass substrate or an upper surface of a polarization plate overlaid on the CF glass substrate is provided and the conductive film and a ground electrode on a TFT glass substrate are electrically connected, wherein the conductive film and the ground electrode are electrically connected with a conductive tape having adherence, a conductive paste is adhered to a part crossing a border between the conductive tape and the conductive film and a part crossing a border between the conductive tape and the ground electrode, and the conductive tape is provided with an allowance in a length thereof such that an entire length of the conductive tape is longer than a shortest distance between a connection part between the conductive tape and the conductive film and a connection part between the conductive tape and the ground electrode; wherein in the conductive tape, at parts other than a connection part to the conductive film and a connection part to the ground electrode, an adherence agent is removed.

2. The liquid crystal display panel of claim 1,
wherein the conductive tape is provided with the allowance in the length thereof in a plane parallel to a display surface of the liquid crystal display panel.

3. The liquid crystal display panel of claim 1,
wherein the conductive tape is provided with the allowance in the length thereof in a direction normal to a display surface of the liquid crystal display panel.

4. The liquid crystal display panel of claim 1, wherein the conductive paste is a silver paste.

* * * * *